United States Patent [19]

Mohsen

[11] 3,924,319

[45] Dec. 9, 1975

[54] METHOD OF FABRICATING STEPPED ELECTRODES

[75] Inventor: Amr Mohamed Mohsen, North Plainfield, N.J.

[73] Assignee: Bell Telephone Laboratories Incorporated, Murray Hill, N.J.

[22] Filed: Aug. 12, 1974

[21] Appl. No.: 496,697

[52] U.S. Cl. ...................... 29/578; 29/580; 29/591; 357/24

[51] Int. Cl.$^2$ .......................................... B01J 17/00

[58] Field of Search ............. 29/578, 580, 624, 591; 357/24

[56] References Cited

UNITED STATES PATENTS

| | | | |
|---|---|---|---|
| 3,651,349 | 3/1972 | Kahng | 357/24 |
| 3,697,786 | 10/1972 | Smith | 357/24 |
| 3,837,907 | 9/1974 | Berglund | 357/24 |
| 3,852,799 | 12/1974 | Waldren | 357/24 |

*Primary Examiner*—W. Tupman

*Attorney, Agent, or Firm*—P. Abolins; D. I. Caplan

[57] ABSTRACT

A method of fabricating integrated circuits produces stepped electrodes having a width, W, equal to the minimum desired feature width in a mask. A silicon dioxide layer is formed on a silicon substrate so there are alternating thick and thin silicon dioxide regions of width W to produce a stepped surface. A doped polysilicon layer is formed on the stepped surface. A mask is used to expose channels of width W centered on alternate steps. Etching the exposed channels to the silicon substrate leaves a first set of stepped polysilicon electrodes of width W. Thick silicon dioxide zones are formed on the exposed silicon substrate. Offsetting the mask a smaller distance than W and selectively etching silicon dioxide is used to produce a series of oxide steps between successive polysilicon electrodes. A subsequent metallization on the oxide steps forms a second set of electrodes between the first set of polysilicon electrodes. Using doped polysilicon for the second set of electrodes in combination with a thick field oxide region allows forming an impurity zone in the substrate without a photolithographic step.

13 Claims, 8 Drawing Figures

METHOD OF FABRICATING STEPPED ELECTRODES

BACKGROUND OF THE INVENTION

This invention relates generally to fabrication of semiconductor devices; and, more particularly, to a method for forming a multiple level metallization having electrodes of small width and essentially zero effective lateral spacing between adjacent isolated portions of electrodes.

A variety of motivations, including size, cost, and high speed performance have led the integrated circuit designer towards ever smaller geometries and, in particular, towards electrodes of ever smaller width with essentially zero effective lateral spacing. In addition, in some solid state devices, such as certain charge transfer device types, small, closely spaced, multiple level electrodes are important to high speed efficient operation, as well as to the above mentioned factors.

Multiple level electrode structures for use with charge transfer devices are taught in U.S. Pat. No. 3,651,349 issued to Kahng et al. on Mar. 21, 1972. Known methods to make multiple level electrode structures are described in an article entitled "A High Density Overlapping Gate Charge Coupled Device Array" by R. W. Bowen, T. A. Zimmerman and A. M. Moshen published in the 1973 *International Electron Device Meeting Technical Digest*. The article teaches forming multiple level electrodes by two methods. One method forms a step by using selective etching between regions of silicon dioxide and silicon nitride. The other method forms an effective electrical potential step by using regions of silicon dioxide in combination with zones of implanted impurities.

It would be desirable to have a method for forming a step which omits such fabrication steps as forming silicon nitride and ion implanting impurities. Silicon nitride creates undesirable surface states at an interface with silicon. Ion implantation introduces another processing step and creates impurity zones which may extend beyond their 9 original boundaries due to subsequent diffusion of impurities.

SUMMARY OF THE INVENTION

To these and other ends, an insulating layer is formed on a substrate. The insulating layer is formed to have alternating relatively thick and relatively thin regions thereby producing a stepped surface. The thick and thin regions have width W and periodicity 2W. A first layer of conducting material is formed on the stepped insulator surface, then a mask is formed on the first conducting layer.

The mask has channels of width W and separation W (i.e., periodicity 2W) and is used to expose portions of the regions between every other step. The exposed portions include the intermediate steps. Selectively etching through the exposed first conducting layer and subsequently exposed insulating layer exposes the underlying substrate. The remaining conducting material islands form stepped electrodes of width W with separation W between successive electrodes.

On the substrate between the successive electrodes there is then formed a stepped zone of insulating material. The lower level of the insulating step is adjacent the upper level of the conducting material islands. The upper level of the insulating step is adjacent the lower level of the conducting material islands. Insulating material is also formed on the electrodes. Thus, conducting material islands are surrounded by insulating material on the top, bottom and sides.

A second conducting material layer is now deposited to form a second set of stepped electrodes between adjacent conducting material islands. It should be appreciated that the second set of electrodes can extend over the first set of electrodes thereby forming a succession of electrodes with zero lateral spacing. Further, width W can be chosen to be the minimum feature width possible in the mask thereby producing electrodes of minimum geometry. Also, doped polysilicon can be used for the second conducting material layer and, in combination with a thick field oxide, define the boundaries of a subsequently formed impurity zone. A non-selective etch can remove any exposed insulating material overlying the substrate. Impurities can be introduced into the substrate to form, for example, source and drain zones.

DETAILED DESCRIPTION

Figure 1:
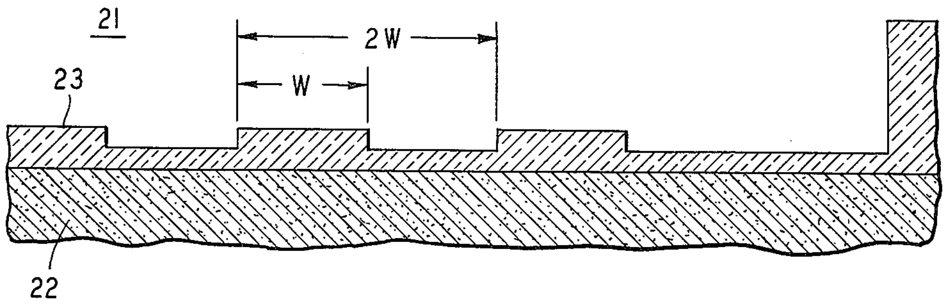
FIGS. 1–8 show, a various successive stages of fabrication, a cross section of a semiconductor device having multiple level electrodes fabricated in accordance with an embodiment of this invention.

FIG. 1 shows in cross section a portion of a structure substantially as it appears following initial preparatory but significant steps in accordance with an embodiment of this invention. As shown, a portion 21 includes a bulk portion 22 which may be virtually any solid material but which, for the purpose of this invention typically will be semiconductive. As an example, the substrate is silicon with impurities such as boron at a concentration advantageously greater than or equal to $10^{16}$ per cubic centimeter. Such concentrations permit formation of controllably small potential barriers which are not too reduced in height by fringing fields.

Overlying bulk portion 22 is an insulating layer 23 advantageously of sufficiently high quality for use under the gate electrode of an insulated gate field effect transistor (IGFET). Layer 23 has a stepped upper surface of successively alternating lower and upper levels. Additionally, shown at the right of layer 23 in FIG. 1 is a portion of a thick insulating region. Typically, such an insulating region surrounds the perimeter of a device and is termed a field oxide. The thickness of the field oxide is typically significantly greater than the remainder of layer 23. Illustratively, layer 23 can be silicon dioxide. As can be appreciated, layer 23 can be formed by thermal oxidation of bulk portion 22 or by any of a variety of deposition techniques known to the art, such as, for example, chemical vapor deposition.

The stepped upper surface of layer 23 can also be formed in a variety of ways. In accordance with this embodiment of the invention, the stepped portion of layer 23 is initially formed to a thickness equal ot the height of the upper level. Then a mask having slots of width W and periodicity 2W exposes the portions of layer 23 where the lower level is desired. The exposed portions of layer 23 are etched through to substrate 22. Thinner silicon dioxide zones are formed on the exposed silicon substrate. An alternate method is to etch through only a portion of the thickness of layer 23 in the regions where the lower level is desired. Another alternate method is to form an insulating layer as thick as the lower level and then to form additional zones of insulating material where the upper level is desired. Typical thicknesses of layer 23 are about 3500 Angstroms for the upper level, about 1500 Angstroms for the lower level, and about 10,000 Angstroms for the field oxide region. Further, in accordance with this embodiment of the invention, the width W can be chosen to be the minimum possible feature width in a mask. A typical value for W is in the range of about 5 to 15 microns.

After forming stepped layer 23, a conducting material layer 24 is nonselectively formed overlying layer 23. Typically, the conducting material is polysilicon containing impurities such as, for example, phosphorous, at a concentration sufficient to produce a resistivity of, for example, 20 ohms per square. In a typical processing sequence the polysilicon layer is deposited on the silicon dioxide and then the impurities are diffused into the polysilicon.

Overlying layer 24 is an insulating layer 25. Advantageously, layer 25 is chosen to be the same material as layer 23, and typically is silicon dioxide. The silicon dioxide layer can be thermally grown to reduce the number of pinholes through the layer. A typical thickness of silicon dioxide layer 25 is about 3000 Angstroms. Layer 25 acts to mask layer 24 and can be replaced by other masking means.

Figure 2:
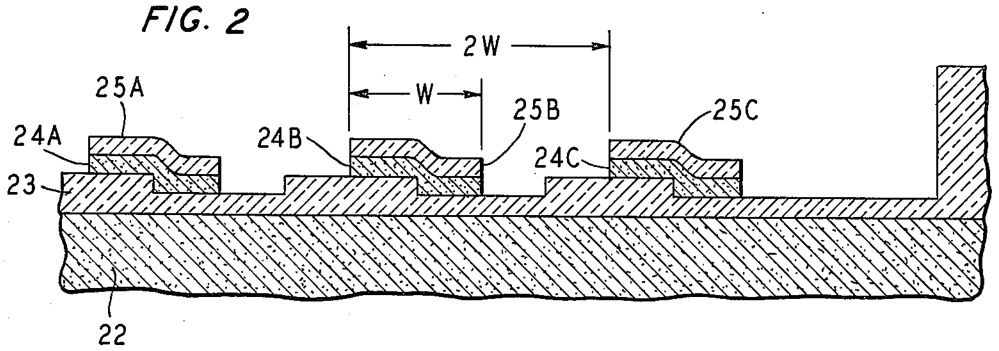

Selective masking and subsequent selective etching of layers 25 and 24 produce the cross section shown in FIG. 2. Remaining portions of layer 24 are labeled 24A, 24B, and 24C; remaining portions of layer 25 are labeled 25A, 25B, and 25C. More specifically, the mask with slots of width W and periodicity 2W is offset to expose areas centered about every other step. Thus, between areas exposed by the slots are silicon dioxide steps with overlying stepped zones of polysilicon and silicon dioxide. The exposed portions of layer 25 8and of layer 24 are removed. For example, a buffered hydrofluoric acid, containing hydrofluoric acid and ammonium fluoride, can be used to etch away the exposed portions of layer 25. A dichromate etch, containing chromium oxide, hydrofluoric acid and water, can be used to etch away the expcsed portions of layer 24.

Figure 3:
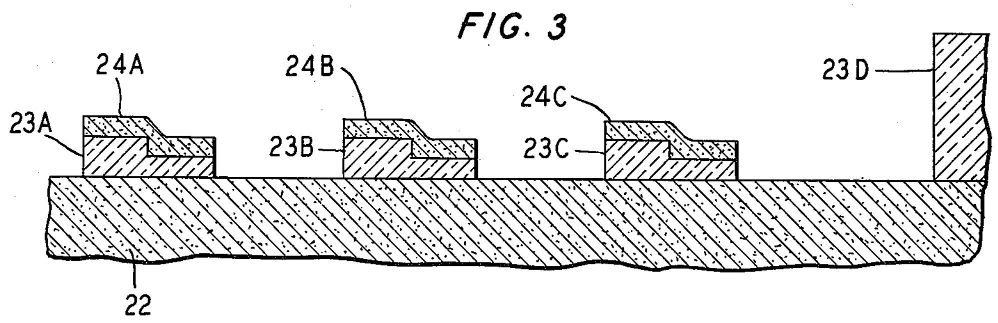

Between remaining islands of polysilicon and silicon dioxide are exposed portions of silicon dioxide layer 23. These exposed portions of silicon dioxide are also removed by etching through to the surface of substrate 22. The etching also removes the reamining portions of layer 25. A typical etchant is buffered hydrofluoric acid. The cross section of the semiconductor device after this processing step is shown in FIG. 3. Exposed portions of silicon substrate 22 are between islands having a zone of polysilicon bounded on the bottom by a zone of silicon dioxide. That is, layer 23 is now also separated into zones 23A, 23B and 23C, and field oxide zone 23D.

Figure 4:
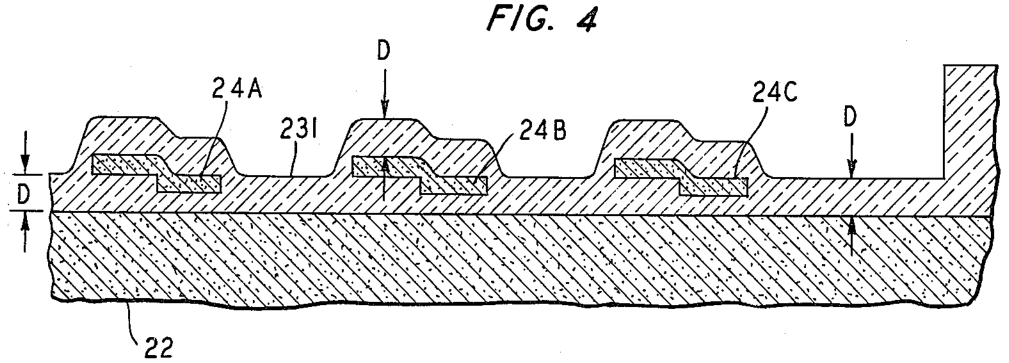

A layer of insulating material is now formed on the exposed portions of substrate 22 and zones 24A, 24B and 24C. Advantageously, in this embodiment, the layer is of silicon dioxide and has a typical thickness, D, of about 3500 Angstroms. The silicon dioxide layer can be formed by oxidizing the exposed silicon and polysilicon surfaces. The just formed silicon dioxide joins silicon dioxide zones 23A, 23B, 23C, and 23D into a silicon dioxide layer 231 shown in FIG. 4.

The mask having slots of width W is offset further from its previous alignment to expose portions of silicon dioxide layer 231. In this particular embodiment the offset is such that the slots expose the portions of layer 231 overlying the upper levels of the stepped polysilicon electrodes and the adjacent one-half of the area between successive polysilicon electrodes. The exposed silicon dioxide is etched to the first underlying silicon or polysilicon surface.

Figure 5:
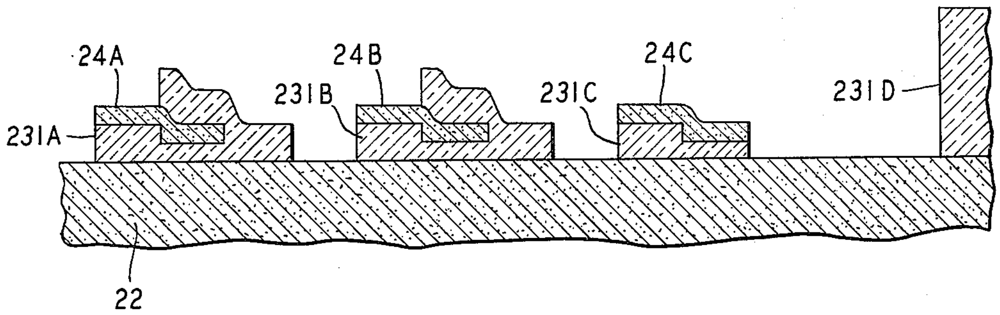

In this embodiment it is desired to form impurity regions in the substrate to serve as source and drain regions. The source region provides charge carriers which are then transferred by the stepped electrodes. The drain region receives charge carriers which have been transferred by the electrodes. Only the formation of the drain region will be illustrated. It will be readily apparent to one skilled in the semiconductor art that a source region can be simultaneously formed at another location. To this end, substrate 22 between electrode 24C and the field oxide region of layer 231 can be left exposed. There is no need to mask any portion of electrode 24C. A cross section of the resulting structure is shown in FIG. 5. As shown, layer 231 is divided into zones 231A, 231B, 231C and 231D. Alternatively, a portion of layer 231 can be left overlying substrate 22 between electrode 24C and the field oxide region of layer 231. This is desirable when an electrode is to be subsequently formed between electrode 24C and the field oxide region overlying an insulating layer of thickness D.

Figure 6:
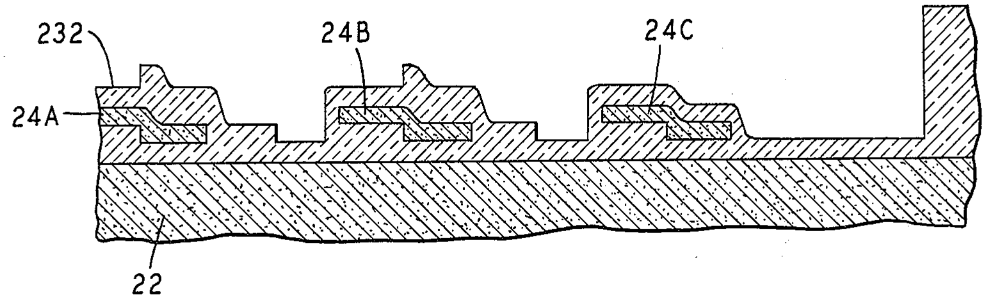

Insulating material zones are now formed on the exposed portions of the silicon substrate and the polysilicon electrodes. Typically, silicon dioxide zones are formed by oxidation of the silicon and polysilicon. The thickness of the silicon dioxide zones is less than that of silicon dioxide layer 231 in the region between successive polysilicon electrodes. Illustratively, the thickness is chosen to be approximately 1500 Angstroms. As a result, there is formed a silicon dioxide step in the region between successive polysilicon electrodes. As a result of forming these silicon dioxide zones, zones 231A, 231B, 231C and 231D are joined to form a silicon dioxide layer 232 shown in FIG. 6. Layer 232 surrounds and insulates the polysilicon electrodes with silicon dioxide on top, bottom and sides.

Figure 7:
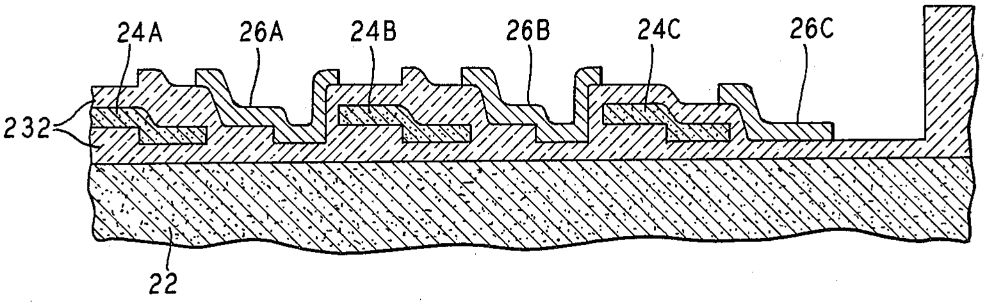

A conducting material layer 26 is now deposited on layer 232. Typically, layer 26 can be formed of such materials as doped polysilicon, aluminum, gold or various metal combinations. Layer 26 can remain a continuous layer or can be selectively etched to produce spaced stepped electrodes between the polysilicon electrodes. FIG. 7 shows stepped electrodes 26A and 26B between successive polysilicon electrodes 24A, 24B and 24C. Additionally, an electrode 26C is formed between polysilicon electrode 24C and the field oxide portion of layer 232. Electrode 26C is not stepped and controls the flow of charge to a subsequently formed drain region. Contact openings can be formed through layer 232 to connect a drive circuit to polysilicon electrodes 24A, 24B and 24C. Alternatively, the polysilicon electrodes can be extended to a lateral edge of the semiconductor body and connected to a common conducting path which, in turn, is connected to the drive circuit.

Using polysilicon for layer 26 is particularly advantageous because a continuous layer can be very well formed. Previous etching of layer 231 may have formed overhangs of the polysilicon electrodes formed from layer 24. Chemical deposition of polysilicon fills in under the overhangs. For example, chemical decomposition of silane can be used. Conductivity determining impurities are introduced after the formation of the polysilicon layer. Typically, n-type conductivity impurities, such as, phosphorous, are introduced by diffusion. When impurities are introduced into layer 26 they can also be introduced into substrate 22 to form source and drain regions.

More specifically, a drain region can be formed in substrate 22 underlying the region between electrode 26C and the field oxide portion. This region can be advantageously exposed by a non-selective etch of all exposed silicon dioxide. The etching is stopped when the portion of the substrate where the drain is to be formed is exposed. Silicon dioxide beneath both sets of electrodes is protected from etching by the overlying electrodes. The etch is not long enough to expose the substrate underlying the relatively much thicker field oxide portion. An impurity introduction into the substrate will now produce an impurity zone 80, shown in FIG. 8, in the substrate. The impurity zone is self-aligned with the adjacent electrode. By introducing the impurities for the source and drain when the impurities are introduced into layer 26 a separate impurity introduction for the source and drain is avoided. Additionally, impurity zones of self-aligned MOS transistors for peripheral circuits can be formed at the same time. After formation of the electrodes and impurity zones, a passivating insulating layer, not illustrated, can be formed over the entire surface of the device.

Figure 8:
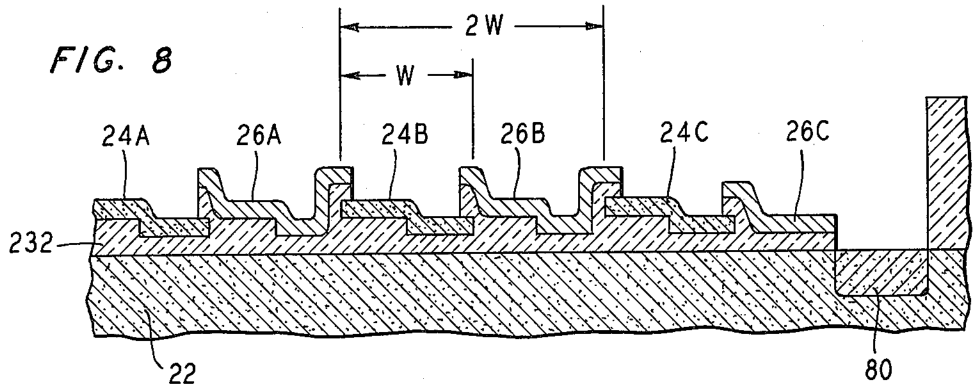

As FIG. 8 shows, a series of stepped electrodes with a width W have been formed. Typically, the electrodes are of width W and are separated by a distance W. Further, the active channels are of width W and are typically separated by a distance W. Two electrodes are required per bit. If the separation between active paths is included, then the typical area for one bit is $4W^2$. It should be appreciated from the previously described steps in this embodiment of the invention that as improved technology makes possible decreases in the minimum feature width W in a mask, correspondingly smaller electrodes can be formed. However, the method is ultimately limited to having the value of W larger than the registration tolerance. That is, the method takes advantage of having a registration tolerance smaller than the minimum feature width.

Further, it should be appreciated that electrodes connected to the same voltage drive circuitry are on the same fabrication level. Likewise, electrodes connected to different voltage drive circuitry are on a different fabrication level. That is, the fabrication technique forms a first insulating layer, a first electrode layer, a second insulating layer and a second electrode layer. Accordingly, electrical shorts between adjacent electrodes in the lower level outside the active channel area do not affect performance and over the active channel area will only cause localized spots of bad transfer efficiency or reduced charge handling capacity. Intralevel shorts in the upper level metal do not affect the device performance at all. Of course, interlevel shorts are fatal to the device performance. However, electrical shorts between different fabrication levels are relatively more unlikely than intralevel shorts.

The relative simplicity of fabrication of the structure is also advantageous. There are no impurity zones to be formed to provide stepped potential wells. Such impurity zones add at least one processing step and have boundaries which may be altered by subsequent diffusion of the impurities. Further, the method is advantageous because it produces interfaces between silicon and silicon dioxide. Such interfaces have favorable operating characteristics and can be produced by oxidation. In contrast, use of such materials as silicon nitride on silicon can produce an undesirably large number of surface states.

Although the invention has been described in detail with reference to two phase charge coupled device structures, it will be apparent that the method can be used in general for forming multiple level metallizations in integrated circuits where minimum electrode size and zero effective lateral spacing between adjacent electrodes are desired.

Various modifications and variations will no doubt occur to those skilled in the arts to which this invention pertains. All such variations which basically rely on the teachings through which this description has advanced the art are properly considered within the scope of this invention.

I claim:

1. A method of forming a solid state device having multiple level electrodes over a substrate comprising the steps of:

forming a first insulating layer disposed on the substrate, the layer having thicker and thinner portions forming a stepped upper surface of a first array of steps, forming a first conducting layer overlying the first insulating layer, selectively etching through the first conducting layer and the first insulating layer to form stepped islands of insulating material overlaid by conducting material having upper and lower levels, and laterally centered about the original location of every other step of the first array in the insulating layer, forming a second insulating layer including forming zones of insulating material on the islands of conducting material and forming stepped zones of insulating material having a second array of steps each located in the area between successive conducting material islands so lower levels of the stepped zones are adjacent to upper levels of the conducting material islands and upper levels of the stepped zones are adjacent to lower levels of the conducting material islands, and depositing a conducting material on the stepped zones of insulating material between the conducting material islands.

2. A method as recited in claim 1 wherein forming the first insulating layer comprises the steps of:

forming a first an insulating layer of uniform thickness overlying the substrate, selectively etching channels through the said insulating layer of uniform thickness to the substrate, and forming zones of insulating material in the channels on the substrate to a thickness less than that of the insulating layer of uniform thickness.

3. The method as recited in claim 2 wherein forming the stepped zones of insulating material between successive islands of conducting material comprises:

forming a first plurality of zones of insulating material between the islands of conducting material about equal in thickness to the thickest portions of the insulating layer, removing portions of each of the zones of insulating material which portions are adjacent to the upper levels of the islands of conducting material, and forming in the openings so exposed a second plurality of zones of insulating material of a thickness less than that of the first plurality of zones of insulating material.

4. A method as recited in claim 3 wherein the substrate is silicon, the insulating material is silicon dioxide, the first conducting layer is polysilicon, and the second conducting layer is polysilicon.

5. A method as recited in claim 4 wherein the channels in the insulating layer are the minimum mask feature width which is less than about 15 microns in width.

6. A method for forming a stepped electrode array for a charge transfer device including the stpes of:

oxidizing a silicon substrate to form a silicon dioxide layer overlying the silicon substrate, etching channels of depth D, width W and periodicity 2W through the first silicon dioxide layer to expose strips of width W of the silicon substrate, oxidizing the thus exposed strips of width W of the silicon substrate to form a first plurality of silicon dioxide zones of a thickness less than D so there is an exposed first stepped silicon dioxide layer surface, forming a polysilicon layer on the first stepped silicon dioxide surface, selectively etching the silicon dioxide layer and the polysilicon layer to leave, centered on every other step of the said first stepped silicon dioxide layer, stepped polysilicon electrodes of width W and to expose the silicon substrate in spacings of width W between the polysilicon electrodes, forming silicon dioxide zones on the polysilicon electrodes and forming silicon dioxide second stepped zones on the exposed silicon substrate between the polysilicon electrodes, so one portion of each second stepped zone has a thickness approximately equal to D and the other portion of each stepped zone has a thickness less than D, and depositing a conducting material on the second stepped silicon dioxide zones between the polysilicon electrodes.

7. The method as recited in claim 6 wherein forming the silicon dioxide zones on the polysilicon electrodes and forming the second stepped silicon dioxide zones between the polysilicon electrodes comprises the steps of:

oxidizing the polysilicon electrodes and the exposed silicon substrate between the polysilicon electrodes to form a silicon dioxide layer of a thickness approximately equal to D, aligning a mask having slots of width W and periodicity 2W to center the slots approximately at the boundaries of the silicon dioxide overlying the silicon substrate between the electrodes and the upper levels of the polysilicon electrodes, selectively etching, through said slots in the mask, the silicon dioxide overlying the upper levels of the polysilicon electrodes and overlying the adjacent halves of the portion of the silicon substrate between the electrodes, to the first underlying silicon and polysilicon surfaces, and oxidizing the exposed silicon and polysilicon surfaces to form silicon dioxide of a thickness less than D thereby forming the second stepped silicon dioxide surfaces between the polysilicon electrodes.

8. The method as recited in claim 7 wherein forming a polysilicon layer on the first stepped silicon dioxide surface comprises the steps of:

depositing a polysilicon layer on the first stepped silicon dioxide surface, and introducing into the polysilicon layer impurities producing a type of semiconductivity.

9. The method as recited in claim 8 wherein the steps of depositing a conducting material on the second stepped silicon dioxide zones between the polysilicon electrodes comprises the steps of:

depositing a polysilicon layer on the silicon dioxide zones overlying the polysilicon electrodes and on the silicon dioxide stepped zones overlying the silicon substrate between the polysilicon electrodes, selectively etching away a portion of the polysilicon layer to expose a silicon dioxide zone above a region in the silicon substrate where an impurity zone is desired, non-selectively etching away the exposed silicon dioxide, and non-selectively introducing conductivity determining impurities into the exposed silicon substrate and the exposed polysilicon layer.

10. The method as recited in claim 9 wherein the impurities are phosphorous introduced by diffusion.

11. The method as recited in claim 10 wherein width W is less than about 15 microns.

12. The method as recited in claim 11 wherein the thickness D is about 3500 Angstroms.

13. The method as recited in claim 12 wherein the thickness less than D is about 1500 Angstroms.

* * * * *